United States Patent
Cho et al.

(10) Patent No.: US 7,639,522 B2
(45) Date of Patent: Dec. 29, 2009

(54) METHOD OF DRIVING MULTI-LEVEL VARIABLE RESISTIVE MEMORY DEVICE AND MULTI-LEVEL VARIABLE RESISTIVE MEMORY DEVICE

(75) Inventors: Woo-yeong Cho, Suwon-si (KR); Du-eung Kim, Yongin-si (KR); Ki-sung Kim, Dongjak-gu (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 68 days.

(21) Appl. No.: 11/855,525

(22) Filed: Sep. 14, 2007

(65) Prior Publication Data

US 2008/0123389 A1    May 29, 2008

(30) Foreign Application Priority Data

Nov. 29, 2006    (KR) ...................... 10-2006-0119148

(51) Int. Cl.
*G11C 11/00* (2006.01)
(52) U.S. Cl. ...................... 365/148; 365/163; 365/145; 365/203; 365/207
(58) Field of Classification Search ................. 365/148, 365/163
See application file for complete search history.

(56) References Cited

U.S. PATENT DOCUMENTS

| | | | |
|---|---|---|---|
| 6,958,934 | B2 | 10/2005 | Fan et al. |
| 6,961,267 | B1 | 11/2005 | Fastow et al. |
| 2004/0228163 | A1* | 11/2004 | Khouri et al. ............... 365/154 |
| 2006/0285392 | A1* | 12/2006 | Incarnati et al. ........ 365/185.22 |

FOREIGN PATENT DOCUMENTS

| | | | |
|---|---|---|---|
| EP | 1729303 A1 * | 12/2006 | |
| JP | 10083686 A | 3/1998 | |
| JP | 2004158143 | 6/2004 | |
| KR | 1020030048881 A | 6/2003 | |
| KR | 1020060030171 A | 4/2006 | |

* cited by examiner

*Primary Examiner*—VanThu Nguyen
*Assistant Examiner*—R Lance Reidlinger
(74) *Attorney, Agent, or Firm*—Volentine & Whitt, PLLC

(57) ABSTRACT

Disclosed is a method of driving a multi-level variable resistive memory device. A method of driving a multi-level variable resistive memory device includes supplying a write current to a variable resistive memory cell so as to change resistance of the variable resistive memory cell, verifying whether or not changed resistance enters a predetermined resistance window, and supplying a write current having an increased or decreased amount from the write current supplied most recently on the basis of the verification result so as to change resistance of the variable resistive memory cell.

20 Claims, 6 Drawing Sheets

METHOD OF DRIVING MULTI-LEVEL VARIABLE RESISTIVE MEMORY DEVICE AND MULTI-LEVEL VARIABLE RESISTIVE MEMORY DEVICE

CROSS REFERENCE TO RELATED APPLICATION

This application claims priority from Korean Patent Application No. 10-2006-0119148 filed on Nov. 29, 2006, the subject matter of which is hereby incorporated by reference.

BACKGROUND OF THE INVENTION

1. Field of the Present Invention

The present invention relates to a method of driving a multi-level variable resistive memory device and a multi-level variable resistive memory device.

2. Description of the Related Art

Memory devices using resistance materials to store data in a non-volatile manner include; phase change random access memory (PRAM), resistive RAM (RRAM), and ferroelectric RAM (FRAM). In contrast, dynamic RAM (DRAM) and contemporary flash memory store data using electrical charge to store data, although DRAM is not nonvolatile in its operating nature. Instead of variations in electrical charge non-volatile memory devices using resistance materials store data in relation to change of a phase state change for a material like a chalcogenide alloy (PRAM), change in resistance of variable resistance materials (RRAM), and change in a polarization phenomenon of ferroelectric materials (FRAM).

Contemporary memory devices regardless of data storage mechanism, are characterized by continuing attempts to shrink memory cell size, increase integration density, and/or increase data storage density per unit area occupied by the memory device. Among other techniques used to increase data storage density, memory cells capable of storing multiple data bits are increasingly common.

SUMMARY OF INVENTION

In one embodiment, the invention provides a method of driving a write data value to a multi-level variable resistive memory device, the method comprising; applying a write current to a variable resistive memory cell to change the actual resistance of the variable resistive memory cell, verifying whether the actual resistance resides in an intended resistance window associated with the write data value and generating verification results, and varying the amount of the write current in accordance with the verification results, and again applying the write current to the variable resistive memory cell.

In another embodiment, the invention provides a multi-level variable resistive memory device, comprising; a memory cell array including a variable resistive memory cell, a verification sense amplifier verifying whether the actual resistance of the variable resistive memory cell resides in an intended resistance window and generating verification results, a write control circuit supplying a control signal to increase or decrease the amount of write current applied to the variable resistive memory cell on the basis of the verification results, and a write driver supplying the write current to the variable resistive memory cell, and increasing or decreasing the amount of the write current in response to the control signal.

BRIEF DESCRIPTION OF THE DRAWINGS

Embodiments of the invention will be described with reference to the attached drawings in which.

Figure (FIG.) 1 is a graph illustrating a resistance window of a multi-level phase change random access memory device according to an embodiment of the present invention.

DESCRIPTION OF EMBODIMENTS

Advantages and features of the present invention and methods of accomplishing the same may be understood more readily by reference to the following detailed description of embodiments with reference to the accompanying drawings. The present invention may, however, be embodied in many different forms and should not be construed as being limited to only the illustrated embodiments. Rather, these embodiments are presented as teaching examples. Throughout the written description and drawings, like reference numerals refer to like or similar elements.

Hereinafter, embodiments of the invention will be described using a phase change random access memory device (PRAM) example. However, it will be apparent to those skilled in the art that other embodiments of the invention may be applied to others forms of nonvolatile memory using resistance materials, such as a resistive RAM (RRAM), and a ferroelectric RAM (FRAM).

Figure 1:
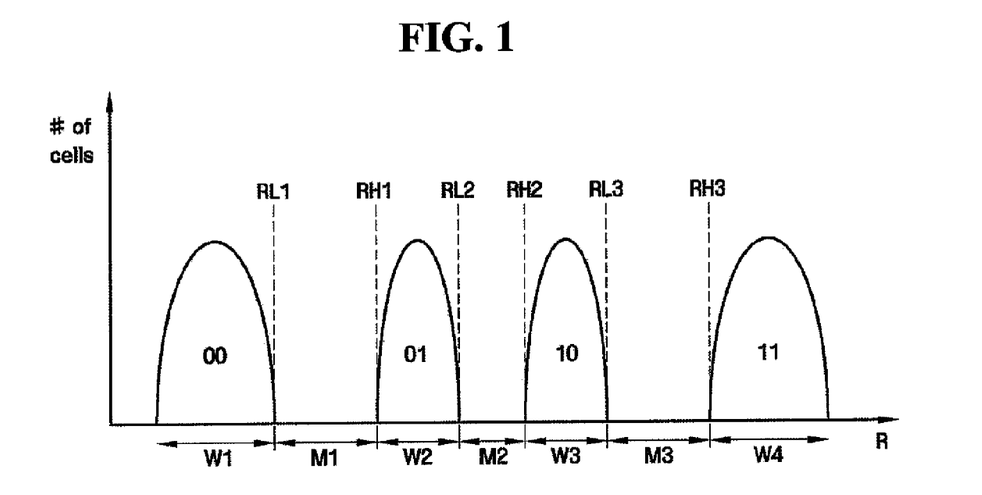

FIG. 1 is a graph illustrating a series of resistance window for a multi-level PRAM according to an embodiment of the invention. In FIG. 1, the exemplary PRAM is assumed to store two bits of data. However, it will be apparent to those skilled in the art that a memory cell storing three or more bits might be used equally well as an example.

Referring to FIG. 1, the multi-level PRAM has four resistance windows W1, W2, W3, and W4. A first resistance window W1 is characterized by a lowest resistance level and a fourth resistance window W4 is characterized by a highest resistance level with a second resistance window W2 and a third resistance window W3 being sequentially intermediate thereto. As shown in FIG. 1, the first resistance window W1 is defined as being less than a first reference resistance RL1. The second resistance window W2 is defined as being greater than a second reference resistance RH1 and less than a third reference resistance RL2. The third resistance window W3 is defined as being greater than a fourth reference resistance RH2 and less than a fifth reference resistance RL3. The fourth resistance window W4 is defined as being greater than a sixth reference resistance RH3. The separate four resistance windows W1, W2, W3, and W4 are ascribed to respective two-bit data states 00, 01, 10, and 11.

Resistance margins M1, M2, and M3 are respectively disposed between the four resistance windows W1, W2, W3, and W4. In particular, a first resistance margin M1 separates the first resistance window W1 from the second resistance window W2. A second resistance margin M2 separates the second resistance window W2 from the third resistance window W3, and the third resistance margin M3 separates the third resistance window W3 from the fourth resistance window W4.

Figure 2:
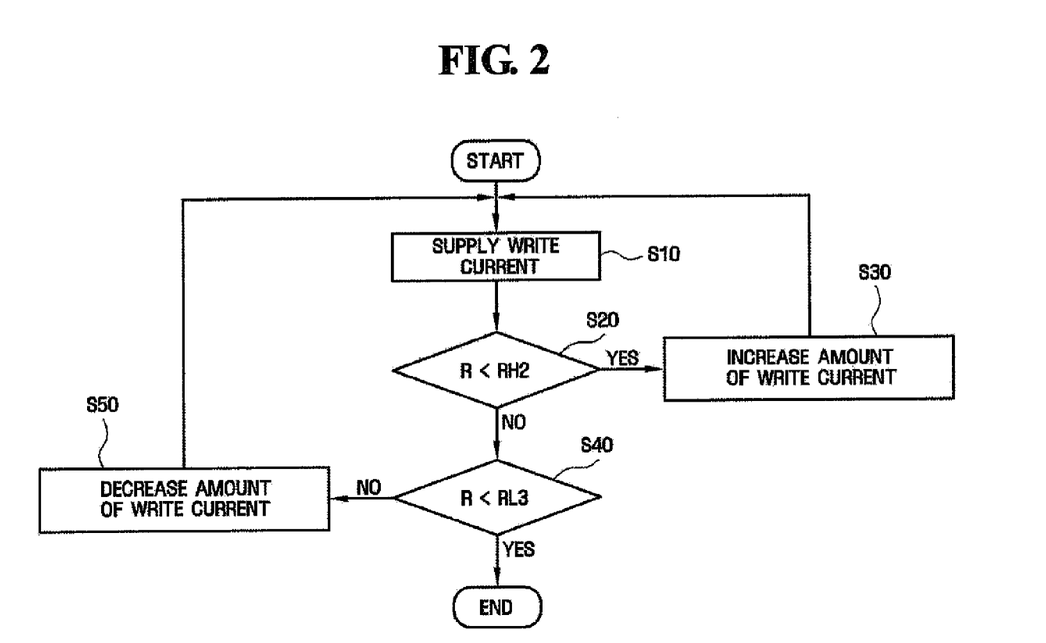
FIG. 2 is a flowchart illustrating a method of driving a multi-level phase change random access memory device according to an embodiment of the present invention.

FIG. 2 is a flowchart illustrating a method of driving a multi-level PRAM according to the embodiment of the invention. The term "driving" in this context refers to the process(es) by which a memory cell in the multi-level PRAM is ascribed a particular resistance value.

Referring to FIG. 2, a write-verification operation is used when two-bit data is written in the memory cell of the multi-level PRAM. That is, a method of writing two-bit data in a particular memory cell includes; supplying a predetermined write current to the memory cell, verifying whether or not the proper data value has been written (i.e., whether the memory cell exhibits the appropriate resistance state for the data intended to be written to the memory cell), and in view of the verification results increasing or decreasing the applied write current.

The example of FIG. 2 assumes that a data value of 10 is to be written to the memory cell. However, other data values might be used as alternate examples.

Initially, write current is supplied to the phase change memory cell in order to change the resistance R exhibited by the phase change memory cell (S10). The write current applied to the phase change memory cell may be set to a constant level. Alternately, a sequentially increasing or decreasing stepped current may be applied. Alternately, an increasing then decreasing or decreasing then increasing current may be applied. Thus, the present invention is not limited to any particular form of applied write current.

Following the initial application of the write current, one or more a data verification operation(s) is performed to determine whether the actual resistance R exhibited by the phase change memory cell corresponds to a resistance window properly indicating the write data (e.g., "10" in the illustrated example which corresponds to resistance window W3) (S20 and S40).

Figure 3A:
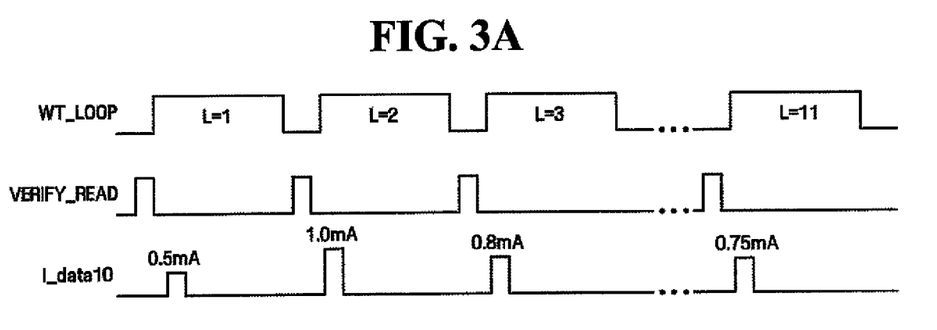
FIGS. 3A and 3B are conceptual timing charts illustrating the method of driving a multi-level phase change random access memory device according to the embodiment of the present invention.
Figure 3B:
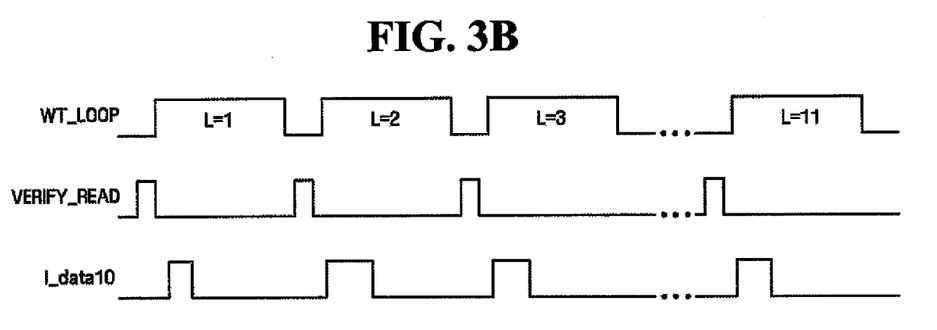

That is, actual resistance R of the phase change memory cell is compared with the fourth reference resistor RH2 (S20). If the actual resistance R exhibited by the phase change memory cell is less than fourth reference resistance RH2, the level of the applied write current should be increased (S30) to increase the resistance R of the phase change memory cell. Application of write current (S10) and comparison of actual resistance R to the fourth reference resistance RH2 (S30) continues until the actual resistance is greater than the fourth reference resistance RH2. Exemplary methods of applying an increased write current within this control loop are illustrated in FIGS. 3A and 3B.

Once the actual resistance R of the phase change memory cell is determined to be greater than the fourth reference resistance RH2 (S20=no), it is compared to the fifth reference resistance RL3 (S40).

If the actual resistance R of the phase change memory cell is greater than the fifth reference resistance RL3, it should be decreased. This may be accomplished by applying a reduced write current to the phase change memory cell (S50). Application of write current (S10) and comparison of actual resistance R to the fifth reference resistance RL3 (S50) continues until the actual resistance is less than the fifth reference resistance RL3. Exemplary methods of applying a decreased write current useful within this control loop are illustrated in FIGS. 3A and 3B.

Once the actual resistance R exhibited by the phase change memory cell enters resistance window W3 and properly corresponds to a data value of 10 using the above-described methods, application of the write current to the phase change memory cell is topped and the write operation ends.

FIGS. 3A and 3B are conceptual timing charts illustrating exemplary methods of driving a multi-level PRAM designed in accordance with an embodiment of the invention.

Referring to FIGS. 3A and 3B, the multi-level PRAM according to an embodiment of the invention writes data during a plurality of write loops L=1 through 11. Before each write loop begins, a verification operation (VERIFY_READ) is performed. During each write loop, data may be written to the phase change memory cell.

In FIG. 3A, the amplitude of an applied write current (I_data10) adapted to write a data value of 10 will vary in accordance with the results of the verification operation. For example, a first applied write current having an amplitude of 0.5 mA is supplied during the first write loop L=1. The following verification result shows that the actual resistance R of the phase change memory cell has not entered the intended resistance window W3 corresponding to a data value of 10. Thus, a write current having an amplitude of 1.0 mA is applied to the phase change memory cell during the second write loop L=2.

In contrast and as shown in FIG. 3B, the pulse width of an applied write current (I_data10) adapted to write a data value of 10 varies in accordance to the verification result. For example, if the actual resistance R exhibited by the phase change memory cell does not enter the intended resistance window W3 corresponding to a data value of 10 in response to the application of an initial write current supplied during the first write loop L=1, the pulse width of the write current applied during the second write loop L=2 is increased over the pulse width of the initial write current supplied during the first write loop L=1.

As shown in FIGS. 2, 3A, and 3B, according to an embodiment of the invention, the amount of the write current (I_data10) may vary over a series of write loops L=1 to 11. Within the illustrated embodiments, the term "amount" as used to characterize the applied write current indicates a particular quantity of electrical charge supplied by the write current. This supplied quantity of electrical charge may be varied, for example, by increasing the amplitude of the write current or the applied period of the write current.

Thus, if the actual resistance R of the phase change memory cell is less than the fourth reference resistance RH2, the amount of the write current increases and, if the actual resistance R of the phase change memory cell is greater than the fifth reference resistance RL3, the amount of the write current decreases. Of course, according to the flowchart of FIG. 2, as each of the write loops L=1 to 11 progresses, the amount of the write current may continuously increase or decrease. As described above in relation to the illustrated embodiment, since actual resistance R of the phase change memory cell can be controlled to place it within an intended resistance window W3, it is possible to improve reliability of the write operation. Further, since it is possible to ensure sufficient resistance margins M2 and M3 in the working example, it is possible to minimize read errors associated with the stored data.

Figure 4:
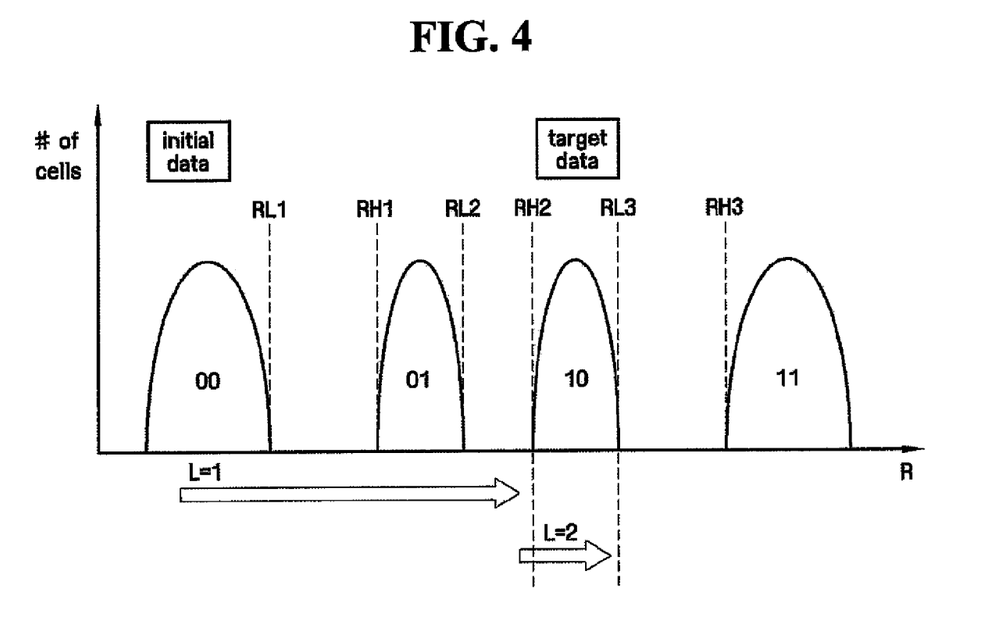
FIGS. 4 to 6 are graphs illustrating the method of driving a multi-level phase change random access memory device according to the embodiment of the present invention.
Figure 5:
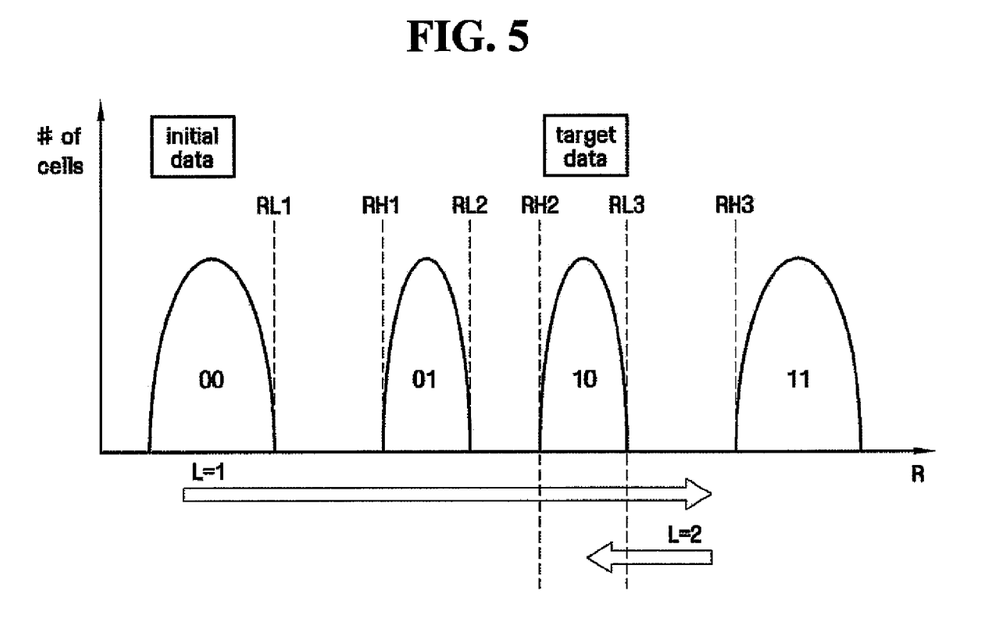
Figure 6:
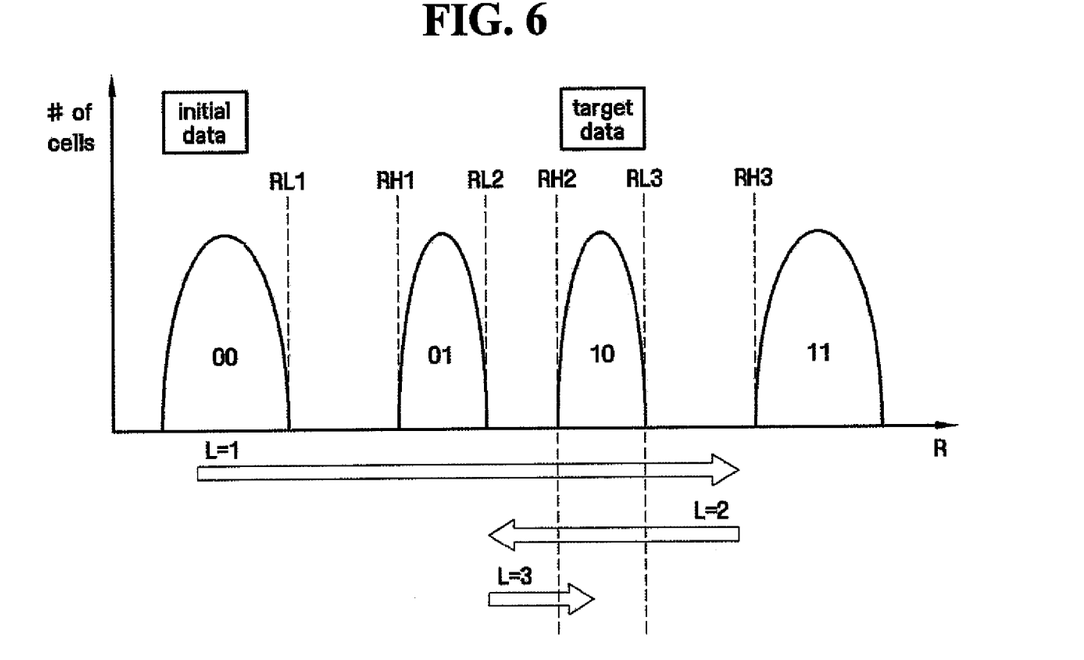

FIGS. 4, 5 and 6 are graphs illustrating exemplary methods for driving a multi-level PRAM according to embodiments of the invention. FIGS. 4, 5 and 6 show a case where a write data value of 10 is written to a phase change memory cell currently exhibiting an actual resistance R indicating a data value of 00. That is, the initial data is 00 and the target data is 10. FIGS. 4, 5, and 6 show examples of variations in the actual resistance R of the phase change memory cell through a number of write loops. These are, however, merely selected examples further illustrating embodiments of the invention. The arrows shown in FIGS. 4, 5 and 6 indicate respective changes in the actual resistance R exhibited by the phase change memory cell having the target data 10 written to each through a series of write loops.

Referring to FIG. 4, the actual resistance R of the phase change memory cell is increased by a write current supplied during a first write loop L=1. However, since the actual resistance R of the phase change memory cell is still less than the fourth reference resistance RH2, the amount of the write current is increased and then the increased write current is again supplied during the second write loop L=2. As the verification results show, since the actual resistance R of the phase change memory cell following the second write loop L=2 resides in the intended resistance window corresponding to a data value of 10, the write operation ends.

Referring to FIG. 5, the actual resistance of the phase change memory cell is increased by a write current supplied during the first write loop L=1. However, since the actual resistance of the phase change memory cell becomes greater than the fifth reference resistance RL3, the amount of the write current is decreased and then the decreased write current is supplied during a second write loop L=2. As the verification results show, since the actual resistance of the phase change memory cell following the second write loop L=2 resides in the intended resistance window corresponding to a data value of 10, the write operation ends.

Referring to FIG. 6, the actual resistance of the phase change memory cell is increased by a write current supplied during a first write loop L=1. However, since the actual resistance of the phase change memory cell is greater than the fifth reference resistance RL3, the amount of the write current must be decreased during a second write loop L=2. However, the verification results show that following the second write loop L=2, the actual resistance of the phase change memory cell is now less than the fourth reference resistance RH2. Hence, the amount of the write current must be increased and supplied during a third write loop L=3. Following the third write loop L=3, the verification results show that the actual resistance of the phase change memory cell reside in the intended resistance window corresponding to a data value of 10, and the write operation ends.

In particular and as illustrated in FIGS. 3A and 3B, the amount of the write current applied during the third write loop L=3 should be greater than the amount of write current applied during the second write loop L=2, but less than the amount of write current applied during the first write loop. Therefore, as shown in FIG. 6, it can be seen that the magnitude of change in the actual resistance of the phase change memory cell following the third write loop is less than the magnitude of change in actual resistance of the phase change memory cell following the second write loop. Thus, in a multi-level PRAM according to an embodiment of the invention, the step increase or decrease in the amount of applied write current may be reduced over a series of write loops.

Figure 7:
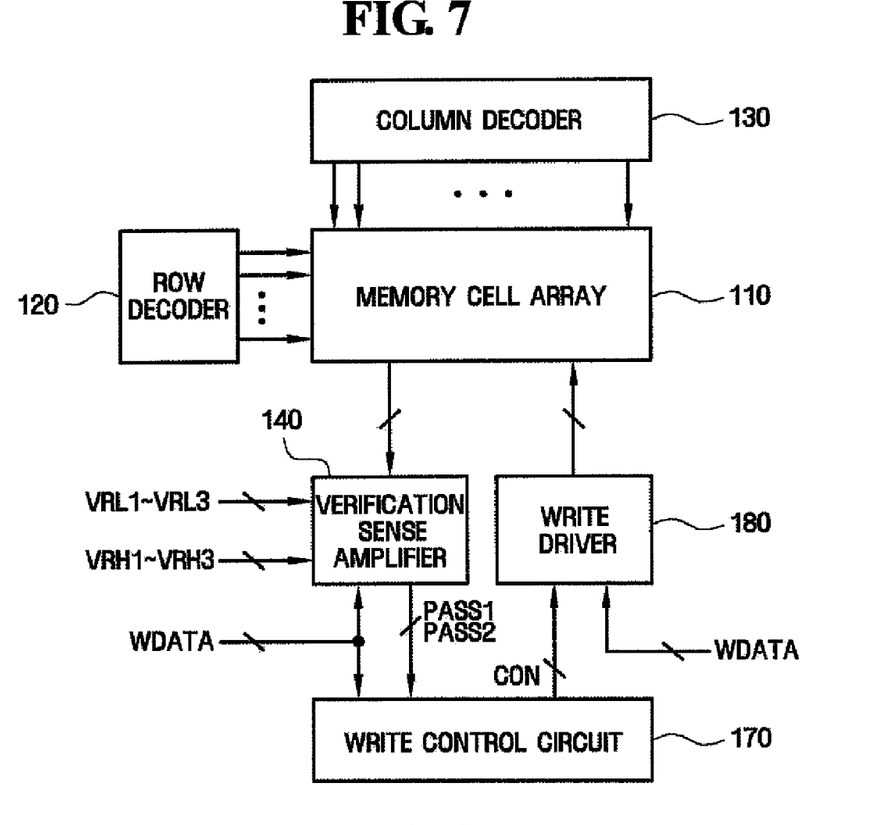
FIG. 7 is a block diagram showing a multi-level phase change random access memory device according to the embodiment of the present invention.

FIG. 7 is an exemplary block diagram showing a multi-level PRAM according to an embodiment of the invention, and capable of implementing the above-described or similar driving methods.

Referring to FIG. 7, the multi-level PRAM generally includes a memory cell array 110, a row decoder 120, a column decoder 130, a verification sense amplifier 140, a write control circuit 170, and a write driver 180.

The memory cell array 110 includes a plurality of phase change memory cells divided into a plurality of cell groups. Though not shown in FIG. 7, the phase change memory cell includes a variable resistance element that includes a phase change material having at least two different resistance values according to a crystal status or an amorphous status, and an access element that controls a current flowing to the variable resistance element. Here, the access element may be a diode or a transistor connected to the resistance element in series. Further, as the phase change material, various materials, such as, GaSb, InSb, InSe, Sb2Te3, and GeTe containing two atoms, GeSbTe, GaSeTe, InSbTe, SnSb2Te4, and InSbGe containing three atoms, and AgInSbTe, (GeSn)SbTe, GeSb (SeTe), and Te81Ge15Sb2S2 containing four atoms may be used.

The row decoder 120 receives and decodes a row address and designates a row of the plurality of phase change memory cells to be written. The column decoder 130 receives and decodes a column address and designates a column of the plurality of phase change memory cells to be written.

The verification sense amplifier 140 verifies whether or not resistance of the phase change memory cell enters a predetermined resistance window.

Specifically, the verification sense amplifier 140 receives first to sixth reference voltages VRL1 to VRL3 and VRH1 to VRH3 corresponding to first to sixth reference resistances RL1 to RL3 and RH1 to RH3, respectively, and receives write data (WDATA) to be written in the phase change memory cell. The reference voltage to be used for sensing is selected among the first to sixth reference voltages VRL1 to VRL3 and VRH1 to VRH3 on the basis of the write data WDATA. For example, in a case where the write data WDATA to be written is 10, since the resistance window corresponding to the data 10 is greater than fourth reference resistance RH2 and less than fifth reference resistance RL3, the reference voltages to be used for sensing are the fourth reference voltage VRH2 corresponding to fourth reference resistance RH2 and the fifth reference voltage VRL3 corresponding to fifth reference resistance RL3. For another example, in a case where the write data WDATA to be written is 01, the reference voltages to be used for sensing are the second reference voltage VRH1 and the third reference voltage VRL2. With the selected reference voltages, it is determined whether the actual resistance of the phase change memory cell resides in the intended resistance window. As the determination result, first and/or second comparison signals PASS1 and PASS2 are supplied to the write control circuit 170.

In a case where the write data WDATA to be written is 10, the first comparison signal PASS1 may indicate a determination result using the fourth reference voltage VRH2 and the second comparison signal PASS2 may indicate a determination result using the fifth reference voltage VRL3. An exemplary write driver 180 will be described in some additional detail with reference to FIGS. 8 and 9.

The write control circuit 170 supplies a control signal CON so as to increase or decrease the amount of the write current on the basis of the verification result of the verification sense amplifier 140.

For example, when the first comparison signal PASS1 is logically low (e.g., indicating that the actual resistance of the phase change memory cell is less than fourth reference resistance RH2), the write control circuit 170 supplies the control signal CON to increase the amount of the write current. When the second comparison signal PASS2 is high (e.g., indicating that the actual resistance of the phase change memory cell is greater than fifth reference resistance RL3), the write control circuit 170 supplies the control signal CON to decrease the amount of the write current. Further, when the first comparison signal PASS1 is high and the second comparison signal PASS2 is low (e.g., indicating that the actual resistance of the phase change memory cell resides in the intended resistance window corresponding to the data 10), write control circuit 170 supplies the control signal CON, such that the write driver 180 discontinues the supply of write current.

Thus, the write driver 180 supplies the write current to the phase change memory cell while increasing or decreasing the amount of the write current in response to the control signal CON.

Figure 8:
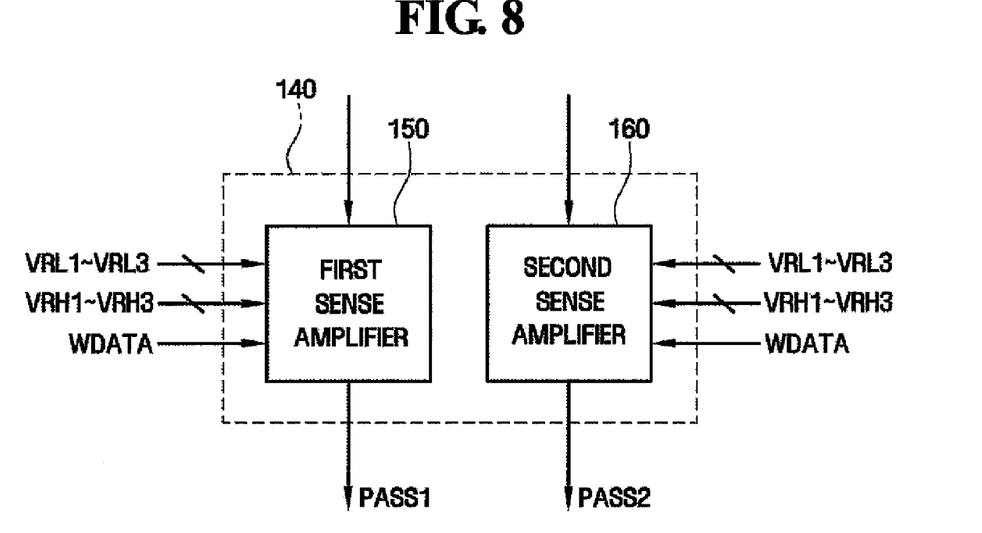
FIG. 8 is an exemplary block diagram showing a verification sense amplifier shown in FIG. 7.
Figure 9:
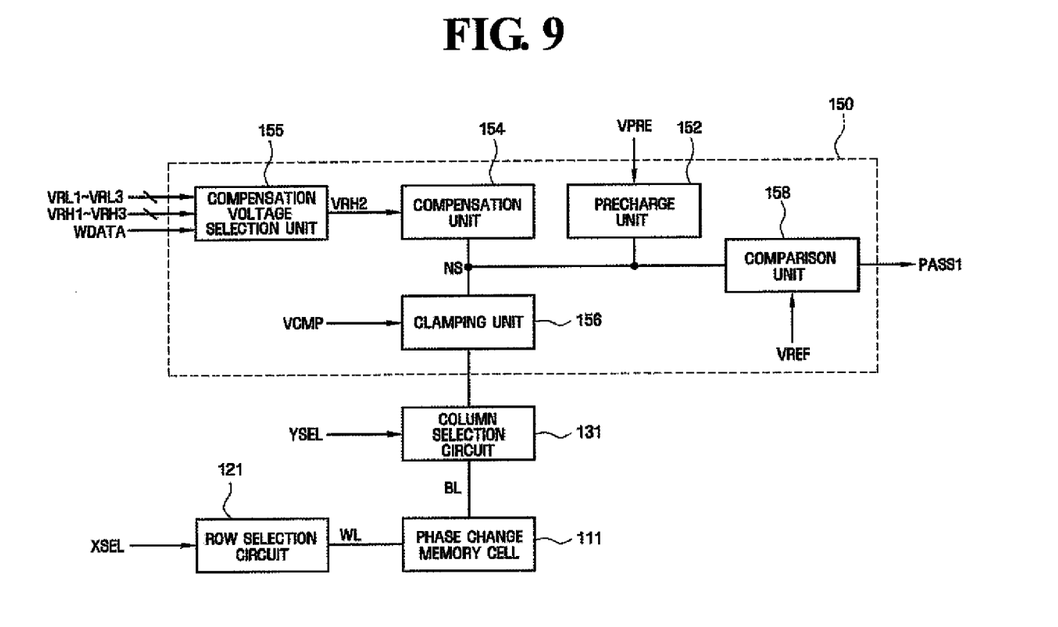
FIG. 9 is an exemplary block diagram showing a first sense amplifier shown in FIG. 8.

FIG. 8 is an exemplary block diagram showing the verification sense amplifier of FIG. 7 in some additional detail. FIG. 9 is an exemplary block diagram showing the first sense amplifier of FIG. 8 in some additional detail. In FIG. 9, a column selection circuit 121, a row selection circuit 131, and a phase change memory cell 111 are described as well as the first sense amplifier for convenience of explanation.

Referring to FIG. 8, the verification sense amplifier 140 includes first and second sense amplifiers 150 and 160 that receive the first to sixth reference voltages VRL1 to VRL3 and VRH1 and VRH3 and the write data WDATA. In a case where the write data WDATA to be written is 01, the first sense amplifier 150 performs sensing using the fourth reference voltage VRH2 and supplies the first comparison signal PASS1, and the second sense amplifier 160 performs sensing using the fifth reference voltage VRL3 and supplies the second comparison signal PASS2. In the exemplary block diagram of FIG. 8, the number of sense amplifiers is determined according to the number of reference voltages necessary for sensing. This will be true for all embodiments of the invention.

Referring to FIG. 9, the column selection circuit 131 receives a column selection signal YSEL to select a bit line BL and the row selection circuit 121 receives a row selection signal XSEL to select a word line WL, thereby selecting the phase change memory cell 111 to be written.

The first sense amplifier 150 applies a current to the selected phase change memory cell 111 and senses a change in level of a sensing node NS that occurs due to a current flowing through the selected phase change memory cell 111 so as to read data.

The above-described sense amplifier 150 may include a precharge unit 152, a compensation unit 154, a compensation voltage selection unit 155, a clamping unit 156, and a comparison unit 158.

The precharge unit 152 precharges a sensing node with a predetermined level, for example, a power supply voltage VDD during a precharge period before the sensing operation. The precharge unit 152 may be a PMOS transistor that is coupled between the power supply voltage VDD and the sensing node NS, and has a gate to which a precharge control signal VPRE is applied.

The compensation unit 154 supplies a compensation current to the sensing node NS so as to compensate a reduction in level of the sensing node NS that occurs due to a current flowing through the selected phase change memory cell 111. In particular, when the data 00 is stored in the phase change memory cell 111, since resistance of the phase change material is small, the amount of the current flowing through the selected phase change memory cell 111 is large. Further, when the data 11 is stored in the phase change memory cell 111, since resistance of the phase change material is large, the amount of the current flowing through the selected phase change memory cell 111 (i.e., "cell current") is small. When it is expressed by an inequality, it can be expressed as "the amount of the cell current in case of data 00">"the amount of the cell current in case of data 01">"the amount of the cell current in case of data 10">"the amount of the cell current in case of data 11". For example, when the amount of the current supplied from the compensation unit 154 corresponds to a cell current in cases of data 10 and data 11, the levels at the sensing node NS for the data 10 and data 11 are kept unchanged, but the levels at the sensing node NS for the data 00 and data 01 are reduced. Therefore, it is possible to distinguish the data 00, data 01, data 10, and data 11 by adjusting the amount of the compensation current supplied from the compensation unit 154. The compensation unit 154 may be a PMOS transistor coupled between the power supply voltage VDD and the sensing node NS, and having a gate receiving the compensation voltage. In this case, the amount of the compensation current may be adjusted by adjusting the compensation voltage.

The compensation voltage selection unit 155 receives the first to sixth reference voltages VRL1 to VRL3 and VRH1 to VRH3 and the write data WDATA to be written, and supplies the reference voltage corresponding to the write data WDATA to be written. The example of FIG. 9 shows a case where the fourth reference voltage VRH2 is selected as the compensation voltage.

The clamping unit 156 performs clamping with respect to a level of the bit line BL within an appropriate range to be read. In particular, the clamping unit 156 performs clamping with respect to the level of the bit line BL to a predetermined level lower than a threshold voltage Vth of the phase change material. This is because a phase of the phase change material of the selected phase change memory cell 111 may change when the level of the bit line BL becomes equal to or greater than the threshold voltage Vth. The clamping unit 156 may be an NMOS transistor coupled between the bit line BL and the sensing node NS, and having a gate receiving a clamping control signal VCMP.

The comparison unit 158 compares the level of the sensing node NS and the reference level REF and outputs the comparison signal PASS1.

When the fourth reference voltage VRH2 is selected as the compensation voltage, if the actual resistance of the phase change memory cell is less than fourth reference resistance RH2, the level of the sensing node NS goes down and the comparison signal PASS1 is output as a logically low value. If resistance of the phase change memory cell is greater than fourth reference resistance RH2, the level of the sensing node NS is remains unchanged and the comparison signal PASS1 is output as a logically high value.

Although the invention has been described in connection with the exemplary embodiments, it will be apparent to those skilled in the art that various modifications and changes may be made thereto without departing from the scope of the present invention. Therefore, it should be understood that the above embodiments are not limitative, but illustrative in all aspects. The scope of the invention is defined by the appended claims, and all changes and modifications that fall within meets and bounds of the claims, or equivalents of such meets and bounds are therefore intended to be embraced by the claims.

What is claimed is:

1. A method of driving a write data value to a multi-level variable resistive memory device, the method comprising:

iteratively applying a write current to a variable resistive memory cell to change the actual resistance of the variable resistive memory cell; and then, verifying whether the actual resistance resides in an intended resistance window associated with the write data value and generating verification results; and then, varying the amount of the write current in accordance with the verification results, and then re-applying the write current to the variable resistive memory cell until the verification results indicate that the actual resistance resides in the intended resistance window, wherein each iterative variance in the amount of write current has a magnitude less than the magnitude of an immediately previous variance in the amount of write current.

2. The method of claim 1, wherein the resistance window is defined in relation to a first reference resistance and a second reference resistance.

3. The method of claim 2, wherein varying the amount of write current comprises increasing the amount of write current when the actual resistance is less than the first reference resistance as indicated by the verification results.

4. The method of claim 3, wherein increasing the amount of write current comprises increasing an amplitude of the write current.

5. The method of claim 3, wherein the increasing amount of write current comprises increasing a pulse width of the write current.

6. The method of claim 2, wherein varying the amount of write current comprises decreasing the amount of write current when the actual resistance is greater than the second reference resistance as indicated by the verification results.

7. The method of claim 6, wherein decreasing the amount of write current comprises decreasing an amplitude of the write current.

8. The method of claim 6, wherein the decreasing amount of write current comprises decreasing a pulse width of the write current.

9. The method of claim 1, further comprising:

stopping the iterative applying of a write current, verifying whether the actual resistance resides in the intended resistance window, varying the amount of write current, and re-applying the write current when the verification results indicate that the actual resistance resides in the intended resistance window.

10. The method of claim 1, wherein the variable resistive memory cell stores two-bit data.

11. The method of claim 1, wherein the variable resistive memory cell is a phase change memory cell.

12. A multi-level variable resistive memory device, comprising:

a memory cell array including a variable resistive memory cell;

a verification sense amplifier verifying whether an actual resistance of the variable resistive memory cell resides in an intended resistance window and generating verification results;

a write control circuit supplying a control signal to increase or decrease an amount of write current applied to the variable resistive memory cell on the basis of the verification results;

a write driver supplying the write current to the variable resistive memory cell through an iteration of write loops, wherein during each write loon iteration, the amount of write current supplied by the write driver is varied in response to the control signal, such that each iterative variation of the write current has a magnitude less than the magnitude of an immediately previous variance in the amount of write current.

13. The multi-level variable resistive memory device of claim 12, wherein the intended resistance window is defined by a first reference resistance and a second reference resistance.

14. The multi-level variable resistive memory device of claim 13, wherein the write driver increases the amount of the write current when the actual resistance is less than the first reference resistance as indicated by the verification results.

15. The multi-level variable resistive memory device of claim 13, wherein the write driver decreases the amount of the write current when the actual resistance is greater than the second reference resistance as indicated by the verification results.

16. The multi-level variable resistive memory device of claim 13, wherein the verification sense amplifier comprises:

a first sense amplifier sensing the actual resistance of the variable resistive memory cell using a first reference voltage corresponding to the first reference resistance; and a second sense amplifier sensing the actual resistance of the variable resistive memory cell using a second reference voltage corresponding to the second reference resistance.

17. The multi-level variable resistive memory device of claim 12, wherein the write driver discontinues supply of the write current to the variable resistive memory cell when the actual resistance resides in the intended resistance window as indicated by the verification results.

18. The multi-level variable resistive memory device of claim 12, wherein the variable resistive memory cell stores two-bit data.

19. The multi-level variable resistive memory device of claim 12, wherein the variable resistive memory cell is a phase change memory cell.

20. A multi-level variable resistive memory device, comprising:

a memory cell array including a variable resistive memory cell;

a verification sense amplifier verifying whether an actual resistance of the variable resistive memory cell resides within an intended resistance window and generating verification results;

a write control circuit supplying a control signal to increase or decrease an amount of write current applied to the variable resistive memory cell in response to the verification results; and a write driver supplying the write current to the variable resistive memory cell, and increasing or decreasing the amount of the write current in response to the control signal through an iteration of write loops, wherein during each write loop iteration, the amount of write current supplied by the write driver is varied in response to the control signal, such that each iterative variation of the write current has a magnitude less than the magnitude of an immediately previous variance in the amount of write current, and wherein the verification sense amplifier comprises, a precharge unit precharging a sensing node, a compensation unit supplying a compensation current to the sensing node to compensate for a reduction in a voltage level of the sensing node due to current flow through the variable resistive memory cell, a compensation voltage selection unit receiving a plurality of reference voltages and write data to be written to the variable resistive memory cell, and supplying a selected one of the plurality of reference voltage corresponding to the write data, and a comparison unit comparing a voltage level of the sensing node with the selected reference level, and generating a comparison signal defining the verification results.

* * * * *